United States Patent
Yamashita et al.

(10) Patent No.: US 7,320,856 B2
(45) Date of Patent: Jan. 22, 2008

(54) MANUFACTURING METHOD OF PATTERN FORMED BODY

(75) Inventors: Kaori Yamashita, Tokyo (JP); Takashi Sawada, Tokyo (JP); Hironori Kobayashi, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/527,031

(22) Filed: Sep. 26, 2006

(65) Prior Publication Data

US 2007/0122754 A1     May 31, 2007

(30) Foreign Application Priority Data

Sep. 29, 2005   (JP) ............................. 2005-285295

(51) Int. Cl.
*G03F 7/00*     (2006.01)
(52) U.S. Cl. .......................................... 430/396; 134/1
(58) Field of Classification Search .................... None
See application file for complete search history.

(56) References Cited

U.S. PATENT DOCUMENTS

2001/0026355 A1* 10/2001 Aoki et al. ................... 355/30

FOREIGN PATENT DOCUMENTS

JP         2001-324816         11/2001

* cited by examiner

*Primary Examiner*—John A. McPherson
(74) *Attorney, Agent, or Firm*—Ladas & Parry LLP

(57) ABSTRACT

A main object of the present invention is to provide a manufacturing method of a plurality of pattern formed bodies which makes it possible that even if the pattern formed bodies are continuously manufactured, their property varied patterns are each made into a target pattern form with high precision. To achieve the object, the invention provides a manufacturing method of a plurality of pattern formed bodies, comprising a pattern forming step and a foreign matter removing step, wherein the pattern forming step is a step of radiating vacuum-ultraviolet light through a photomask to a pattern forming substrate, varying a surface property by the vacuum-ultraviolet light, and forming a property varied pattern with the property varied on a surface of the pattern forming substrate to form a pattern formed body; the pattern forming step is repeated plural times to manufacture a plurality of the pattern formed bodies; and the foreign matter removing step is a step performed between the repeated pattern forming steps and of radiating vacuum-ultraviolet light from the same light source as used in the pattern forming step to the photomask, in a state where the photomask and the pattern forming substrate are not opposed to each other, to remove a foreign matter deposited onto the photomask.

1 Claim, 1 Drawing Sheet

MANUFACTURING METHOD OF PATTERN FORMED BODY

BACKGROUND OF THE INVENTION

1. Field of the Invention

The present invention relates to a manufacturing method of a pattern formed body which has a surface property varied in a pattern form and is used in the manufacture of, for example, a color filter.

2. Description of the Related Art

Conventionally, various methods have been suggested as a manufacturing method of a plurality of pattern formed bodies in which designs, images, characters, circuits or other various patterns are formed on a base material. For example, there are also used lithographic printing, offset printing, a printing method of using a heat-mode recording material to produce a lithographic original master, and other methods. Moreover, there is known, for example, a manufacturing method of a pattern formed body by photolithography, comprising the step of radiating light patternwise to a photoresist layer coated on a base material, developing the photoresist, and then etching the photoresist, or the step of using a material having functionality as a photoresist, and exposing the photoresist to light to form a target pattern directly.

However, the above-mentioned printing methods have: a problem that at the time of manufacturing a highly precise pattern formed body, which is used in such as a color filter, only low location accuracy is attained; and other problems. Thus, it is difficult to use the methods. The above-mentioned photolithography has: a problem that it is necessary to dispose of waste liquid since a photoresist is used and the photoresist is required to be developed with a developing liquid and be etched after exposed to light; and other problems. When a material having functionality is used as the photoresist, there is caused a problem that this material is deteriorated with an alkali solution or the like that is used in development.

Thus, there is suggested a manufacturing method of a pattern formed body, comprising the step of radiating vacuum-ultraviolet light patternwise through a photomask to a pattern forming substrate having a base material and an organic molecule membrane formed on the base material and made of an organic material, thereby decomposing and removing the organic molecule membrane to form a pattern (see Japanese Patent Application Laid-Open (JP-A) No. 2001-324816). According to this method, a pattern formed body can be manufactured without using any photoresist; therefore, the pattern formed body can easily be manufactured without any developing solution or the like.

Such formation of a pattern by use of vacuum-ultraviolet light is attained by decomposition and removal of the organic molecule membrane by action of the vacuum-ultraviolet light. Specifically, when vacuum-ultraviolet light is radiated thereto, molecular bonds of an organic material of the organic molecule membrane are cleaved by action of the vacuum-ultraviolet light; or in the presence of oxygen, oxygen atom radicals generated by excitation of the oxygen act onto the organic material, so that the organic material of the organic molecule membrane becomes a decomposition product and then this product is volatilized and removed from the pattern forming substrate so as to form a pattern.

However, in the case of manufacturing pattern formed bodies continuously by radiation of vacuum-ultraviolet light through a photomask as described above, a decomposition product and so on which are generated on a used pattern forming substrate deposit onto the photomask. This foreign matter hinders the action of the above-mentioned oxygen atom radicals. Conversely, the foreign matter may contribute to a change in the property of the pattern forming substrate. Thus, there remains a problem that patterns having a uniform line width are not easily formed on the pattern forming substrate.

SUMMARY OF THE INVENTION

Thus, it is desired to provide a manufacturing method of a plurality of pattern formed bodies which makes it possible that even if the pattern formed bodies are continuously manufactured, their property varied patterns are each made into a target pattern form with high precision.

The present invention provides a manufacturing method of a plurality of pattern formed bodies, comprising a pattern forming step and a foreign matter removing step, wherein the pattern forming step is a step of radiating vacuum-ultraviolet light through a photomask to a pattern forming substrate, varying a surface property by the vacuum-ultraviolet light, and forming a property varied pattern with the property varied on a surface of the pattern forming substrate to form a pattern formed body; the pattern forming step is repeated plural times to manufacture a plurality of the pattern formed bodies; and the foreign matter removing step is a step performed between the repeated pattern forming steps and of radiating vacuum-ultraviolet light from the same light source as used in the pattern forming step to the photomask, in a state where the photomask and the pattern forming substrate are not opposed to each other, to remove a foreign matter deposited onto the photomask.

According to the invention, the foreign matter deposited to the photomask surface is removed through the foreign matter removing step performed between the plural pattern forming steps; accordingly, it is possible to prevent the foreign matter deposited to the photomask from producing an effect onto the formation of the property varied pattern. According to invention, therefore, in each of the pattern forming steps, the property of the pattern forming substrate can be varied into a target pattern form with a high precision. As a result, plural pattern formed bodies each having a high quality can be manufactured. In the invention, for the radiation of the vacuum-ultraviolet light in the foreign matter removing step, the same light source as used in the pattern forming step is used; therefore, the foreign matter removing step can be performed without taking out the photomask from the pattern formed body manufacturing apparatus used or using any especial device. Thus, the invention has an advantage that pattern formed bodies can be effectively manufactured.

In the invention, the foreign matter removing step may be a step of radiating the vacuum-ultraviolet light in a state where the photomask and a reflecting plate for reflecting the vacuum-ultraviolet light from the light source are opposed to each other. According to this, in the foreign matter removing step, not only the radiated vacuum-ultraviolet light but also the vacuum-ultraviolet light reflected on the reflecting plate can be caused to act on the foreign matter deposited to the photomask. Consequently, the foreign matter can be removed further effectively.

According to the invention, patterning can be attained by use of a photomask from which any foreign matter has been removed. Thus, the invention produces an advantageous effect that a plurality of pattern formed bodies in which their properties are varied into a target pattern form with high precision can be manufactured.

DESCRIPTION OF THE PREFERRED EMBODIMENTS

The present invention is concerned with a manufacturing method of a pattern formed body which has a surface property varied in a pattern form and is used in the manufacture of, for example, color filter.

The manufacturing method of a plurality of pattern formed bodies of the present invention, comprises a pattern forming step and a foreign matter removing step, wherein the pattern forming step is a step of radiating vacuum-ultraviolet light through a photomask to a pattern forming substrate, varying a surface property by the vacuum-ultraviolet light, and forming a property varied pattern with the property varied on a surface of the pattern forming substrate to form a pattern formed body; the pattern forming step is repeated plural times to manufacture a plurality of the pattern formed bodies; and the foreign matter removing step is a step performed between the repeated pattern forming steps and of radiating vacuum-ultraviolet light from the same light source as used in the pattern forming step to the photomask, in a state where the photomask and the pattern forming substrate are not opposed to each other, to remove a foreign matter deposited onto the photomask.

Figure 1A:
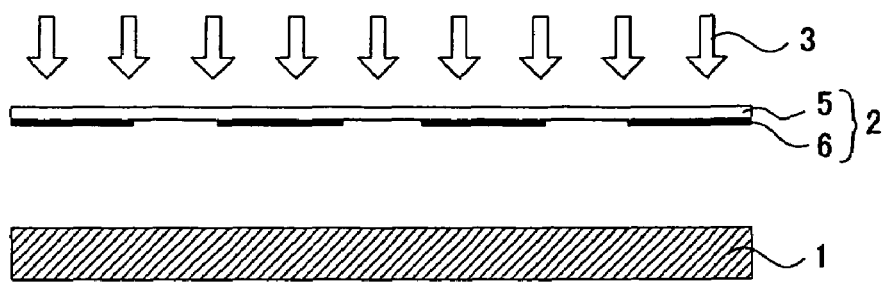
FIGS. 1A and 1B are each a process drawing illustrating an example of a manufacturing method of a pattern formed body according to the invention.
Figure 1B:
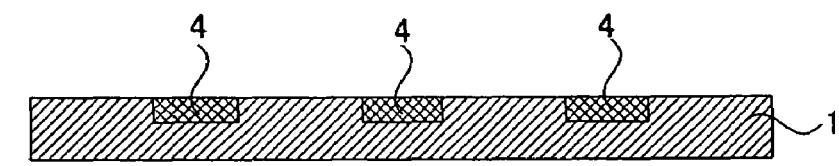
Figure 2:
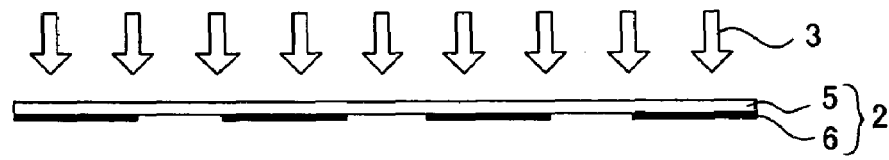
FIG. 2 is an explanatory view for explaining a foreign matter removing step in the invention.

As illustrated in, for example, FIGS. 1A and 1B, in the manufacturing method of a plurality of pattern formed bodies of the invention, the following pattern forming step is performed: a pattern forming step of radiating vacuum-ultraviolet light 3 through a photomask 2 to a pattern forming substrate 1 having a surface the property of which is variable by the vacuum-ultraviolet light 1 (FIG. 1A), thereby forming a pattern formed body having a property varied pattern 4, in which the property is varied, on the surface of the pattern forming substrate 1 (FIG. 1B). In the invention, the pattern forming step is performed plural times. As illustrated in, for example, FIG. 2, between the plural pattern forming step, performed is the foreign matter removing step of radiating the vacuum-ultraviolet light 3 onto the photomask 2, thereby removing a foreign matter deposited to the photomask 2.

In the case of radiating, in the prior art, vacuum-ultraviolet light through the photomask to a pattern forming substrate so as to pattern the pattern forming substrate, decomposition product or the like that is generated on the pattern forming substrate may vaporize to adhere onto the photomask arranged oppositely to the pattern forming substrate. As a result, at the time of patterning a different pattern forming substrate subsequently, the foreign matter deposited to the photomask may contribute to a variation in the property of the pattern forming substrate or the foreign matter may hinder the action of oxygen atom radicals generated by action of the vacuum-ultraviolet light. For this reason, the prior art has a problem that when pattern formed bodies are continuously manufactured, it is difficult to make their property varied patterns into a uniform target form, that is, to make line widths of the patterns equal to each other.

In the invention, however, between the pattern forming steps, the foreign matter removing step of removing the foreign matter deposited to the photomask is performed; therefore, when the photomask is used to performed any one of the pattern forming steps, it is possible to prevent the line width of the resultant property varied pattern from being varied by the foreign matter deposited to the photomask. As a result, even when pattern formed bodies are continuously manufactured, their property varied patterns can be formed into a uniform target form with a high precision. Thus, the invention makes it possible to manufacture stably plural pattern formed bodies capable of forming any one of various functional parts into a target pattern form.

Furthermore, according to the invention, in the above-mentioned foreign matter removing step, the same light source as used in the pattern forming step is used; thus, the foreign matter removing step can be performed without taking out the photomask from the pattern formed body manufacturing apparatus. As a result, pattern formed bodies can be effectively manufactured. At this time, there is also produced an advantage that it is unnecessary to fit any especial member to the pattern formed body manufacturing apparatus.

Each of the steps in the manufacturing method of a plurality of pattern formed bodies according to the invention will be described hereinafter.

1. Foreign Matter Removing Step

First, the foreign matter removing step in the invention is described herein. The step is a step which is performed between plural pattern forming steps performed repeatedly, and further this step is a step of radiating, to the photomask, vacuum-ultraviolet light from the same light source as used in the pattern forming step in a state where the photomask and the pattern forming substrate are not opposed to each other, thereby removing an foreign matter deposited onto the photomask.

The wording "between plural pattern forming steps" means any one of individual intervals between plural pattern forming steps, or any two or more of the individual intervals. Thus, in the invention, for example, the present step may be performed whenever each of the pattern forming steps is finished, or may be performed whenever plural ones of the pattern forming steps are finished. The wording "a state where the photomask and the pattern forming substrate are not opposed to each other" means a state where the pattern forming substrate is not arranged in a scope over which the action of the above-mentioned vacuum-ultraviolet light extends.

The light source used in the vacuum-ultraviolet light radiation in the present step is the same as used in the pattern forming step, which will be detailed later, and is a light capable of varying the surface property of the pattern forming substrate and further radiating a wavelength making it possible to remove the foreign matter deposited to the photomask.

The wavelength of the vacuum-ultraviolet light radiated from this light source is set usually into the range of 100 to 250 nm, preferably from 150 to 200 nm, whereby the foreign matter deposited to the photomask can be more effectively removed. Specifically, the light source can be selected from an excimer lamp, a low-pressure mercury lamp, and other various light sources. The radiating period of the vacuum-ultraviolet light, the radiation intensity thereof, and other properties thereof are appropriately selected in accordance with the kind of the light source, the kind of the foreign matter, and others.

In the invention, the vacuum-ultraviolet light may be radiated in a state where the photomask and a reflecting plate for reflecting the vacuum-ultraviolet light from the light source are opposed to each other. In this manner, not only the vacuum-ultraviolet light radiated directly from the light source but also the vacuum-ultraviolet light reflected on the reflecting plate can be caused to act on the foreign matter deposited to the photomask. Consequently, the foreign matter can be more effectively removed.

The reflecting plate may be arranged, for example, at a position where the pattern forming substrate should be arranged in the pattern forming step, which will be detailed later, instead of the pattern forming substrate, or may be beforehand arranged in the pattern formed body manufacturing apparatus. This reflecting plate may be a member made of a single reflecting layer which has self-supportability and which vacuum-ultraviolet light can be reflected on, or a member in which a reflecting layer on which vacuum-ultraviolet light can be reflected is formed on a substrate. The material used in this reflecting layer is not particularly limited, and is preferably a metal material, specific examples of which include aluminum, silver, and iron.

In the case of the reflecting plate in which a reflecting layer is formed on a substrate, the method for forming the reflecting plate is usually a method of depositing a metal as described above onto a surface of the substrate by vacuum vapor deposition or the like. In the case of the reflecting layer having self-supportability, the method for forming the layer may be a method of subjecting one surface of a metal plate made of a metal as described above to mirror finishing. The above-mentioned substrate is not particularly limited as long as the substrate is a substrate on which the reflecting layer can be supported, and may be made of an organic material or an inorganic material.

(Photomask)

Next, the photomask, from which the foreign matter is removed in the present step, is described herein. This photomask is not particularly limited as long as the photomask is a photomask which is used when vacuum-ultraviolet light is radiated to the pattern forming substrate and makes it possible to radiate the vacuum-ultraviolet light to the area where the above-mentioned property varied pattern is to be formed. As illustrated in, e.g., FIG. 1A, this photomask usually has a transparent base material 5 and a light shielding part 6 formed on the transparent base material 5.

Each of the constituents of the photomask will be described hereinafter.

(1) Light Shielding Part

First, the light shielding part used in the photomask is described herein. This light shielding part is not particularly limited as long as the part is a part which is formed on the transparent base material, which will be detailed later, contributes to the formation of the property varied pattern, and does not transmit vacuum-ultraviolet light. The material of this light shielding part is appropriately selected in accordance with properties of the face where the light shielding part is to be formed, the method for forming the light shielding part, and others.

For example, the light shielding part may be formed by forming a thin film, about 300 to 2000 Å in thickness, made of a metal such as chromium by sputtering, vacuum vapor deposition or the like, and then patterning this thin film. The method for the patterning may be, for example, an ordinary patterning method such as sputtering, metal etching, or lifting-off.

The method for forming this light shielding part may be, for example, a method of forming a layer wherein light shielding particles made of such as carbon fine particles, a metal oxide, an inorganic pigment, or an organic pigment are incorporated into a resin binder into a pattern form. Examples of the resin binder to be used may be: a single or mixture made of one or more selected from resins such as polyimide resin, acrylic resin, epoxy resin, polyacrylamide, polyvinyl alcohol, gelatin, case in and cellulose; a photosensitive resin; or an O/W emulsion type resin composition such as a product obtained by emulsifying reactive silicone. The method for patterning this resin light shielding part may be an ordinarily-used method, such as photolithography or printing.

About the position where the light shielding part is formed is as follows: the light shielding part may be formed on the transparent base material side which is to face the pattern forming substrate when the photomask and the pattern forming substrate are arranged to oppose to each other, or may be formed on the transparent base material side which is not to face the pattern forming substrate at that time.

The shape of the light shielding part is not particularly limited, and can be appropriately selected in accordance with the pattern to be formed in the pattern forming substrate, and others.

The width of lines of the light shielding part is set usually to a value of about 0.1 µm or more, preferably to a value of about 1 µm or more. When the width is set into this range, the property varied pattern can be formed into a target pattern form without being affected by diffraction of the vacuum-ultraviolet light.

(2) Transparent Base Material

Next, the transparent base material used in the photomask is described herein. This transparent base material is not particularly limited as long as the transparent base material is a base material which has transmittance to vacuum-ultraviolet light and on which the light shielding part can be formed. The transparent base material may be a transparent base material used in an ordinary photomask. Specific examples of this transparent base material include transparent rigid materials, which are not flexible, such as a quartz plate, a Pyrex (registered trademark) glass, and a synthetic quartz plate; and transparent flexible materials, such as a transparent resin film, or an optical resin plate. If necessary, the base material may be subjected to surface treatment to prevent elution-out of alkalis, give gas barrier performance, and attain other purposes.

In order to improve adhesion between the surface of the transparent base material and the light shielding part, an anchor layer may be formed on the transparent base material. This anchor layer maybe made of, for example, a silane-, or titanium-coupling agent.

2. Patterning Forming Step

Next, the pattern forming step in the invention is described herein. This step is a step of radiating the vacuum-ultraviolet light through a photomask to a pattern forming substrate having a surface the property of which is varied by action of the vacuum-ultraviolet light, thereby forming, on the surface of the pattern forming substrate, a property varied pattern, in which the property is varied, so as to form a pattern formed body. In the invention, the pattern forming step is performed at least two times. The number of repeated times of the step is not particularly limited.

In the invention, the foreign matter removing step is performed between the pattern forming steps; therefore, even when pattern formed bodies are continuously manufactured, the line widths and other dimensions of the property varied patterns in the individual pattern formed bodies can be less varied. Thus, the property varied patterns can be formed into a target form with a high precision.

The pattern forming substrate used in the present step, and the method for radiating vacuum-ultraviolet light will each be described hereinafter.

(Pattern Forming Substrate)

First, the pattern forming substrate used in the invention is described herein. The pattern forming substrate is not particularly limited about its structure as long as the pattern forming substrate is a substrate the surface property of which is variable by action of vacuum-ultraviolet light when the vacuum-ultraviolet light is radiated through the photomask.

The pattern forming substrate maybe, for example, a member having a supporting substrate and a property variable layer formed on the supporting substrate and the surface property of which is varied by action of vacuum-ultraviolet light, or a member made only of a property variable layer the surface property of which is varied by action of vacuum-ultraviolet light. In the invention, the property variable layer is in particular preferably a layer containing an organic material. In the case where the property variable layer contains an organic material, a foreign matter deposits easily to the photomask when the photomask is used to pattern the pattern forming substrate. It is therefore possible to make especially good use of the advantages of the invention.

The kind of the variable property of the property variable layer in the pattern forming substrate is not particularly limited, and may be, for example, surface wettability variable by action of vacuum-ultraviolet light, adhesiveness to a specified substance variable by action of vacuum-ultraviolet light. In the invention, the property variable layer is preferably a layer the surface wettability of which is varied by action of vacuum-ultraviolet light, more preferably a wettability variable layer the contact angle of which with a liquid is lowered by action of vacuum-ultraviolet light. This makes it possible to render the area where the wettability is varied in the present step a lyophilic area and render the area where the wettability is not varied in the present step a liquid repellent area. Accordingly, when a functional part forming coating solution is coated onto a pattern formed body manufactured by the invention by, for example, a coating method, the functional part forming coating solution can be caused to adhere only to its property varied pattern, which is a lyophilic area. Consequently, a functional part can be made into a highly precise pattern form.

The lyophilic area is defined herein as an area having a lower contact angle with a liquid than that of any area adjacent thereto by 1° or more, and means an area which has a small contact angle with a liquid and has a good wettability to a functional part forming coating solution for forming a functional part. The liquid repellent area means an area which has a large contact angle with a liquid and has a bad wettability to the functional part forming coating solution.

The wettability variable layer used in the pattern forming substrate preferably has a contact angle of 10° or more with the liquid having a surface tension of 40 mN/m, and more preferably has a contact angle of 10° or more with the liquid having a surface tension of 20 mN/m in the state that the wettability of the layer is not varied for the following reason: the area where the wettability is not varied is an area required to have liquid repellency, and thus if the contact angle of the area with a liquid is small, the liquid repellency thereof is insufficient; therefore, for example, when the functional part forming coating solution is coated onto the pattern forming substrate, this coating solution may unfavorably remain on the liquid repellent area also.

When the action of vacuum-ultraviolet light is given to the wettability variable layer in the present step, the area where the wettability is varied preferably has a contact angle of 9° or less with the liquid having a surface tension of 40 mN/m, and more preferably has a contact angle of 10° or less with the liquid having a surface tension of 60 mN/m for the following reason: in the case where the contact angle of the area where the wettability is varied (that is, the lyophilic area) with a liquid is high, for example, at the time of coating the functional part forming coating solution, the lyophilic area may also repel this coating solution; thus, a functional part may not be easily formed on the lyophilic area.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd). Moreover, at the time of the measurement, as the liquids having the various surface tensions, wetting index standard solution manufactured by JUNSEI CHEMICAL CO., LTD. were used.

This wettability variable layer, in which the wettability is varied by action of vacuum-ultraviolet light, may be, for example, a layer containing an organopolysiloxane, specifically a layer containing an organopolysiloxane as described in JP-A No. 2001-074928.

A surfactant, an additive and so forth may be used besides the organopolysiloxane. These may also be, for example, those as described in JP-A No. 2001-074928.

The film thickness of the property variable layer is appropriately selected in accordance with the kind of this layer or kind or usage of the pattern forming substrate, and is usually from about 0.01 μm to 1 mm, in particular, from about 0.1 μm to 0.1 mm.

When the pattern forming substrate has a supporting substrate, the supporting substrate is not particularly limited as long as the substrate can support the property variable layer, in which the property is varied. The kind, the flexibility, the transparency and other properties thereof are appropriately selected in accordance with the usage of the pattern formed body, and so on. In the invention, the supporting substrate may be made of an organic material or an inorganic material. Specifically, the substrate may be a resin film, or a glass, ceramic or metal, and is preferably a plate-form member.

(Radiation of Vacuum-Ultraviolet Light)

Next, the radiation of vacuum-ultraviolet light in the present step is described herein. In the present step, vacuum-ultraviolet light is radiated in a pattern form, along a predetermined direction, through the photomask to the pattern forming substrate.

The wavelength of the vacuum-ultraviolet light is set usually into the range of 100 to 250 nm, preferably into the range of 150 to 200 nm. This makes it possible to form a property varied pattern effectively in the pattern forming substrate.

A light source which can be used to radiate the vacuum-ultraviolet light may be selected from an excimer lamp, a low-pressure mercury lamp, and other various light sources.

The radiation energy amount of the vacuum-ultraviolet light when the vacuum-ultraviolet light is radiated is made into a radiation energy amount necessary for forming a property varied pattern, in which the property of the pattern forming substrate is varied.

When the vacuum-ultraviolet light is radiated, the photomask and the pattern forming substrate may be arranged in any form as long as they are arranged in the state that the action of the vacuum-ultraviolet light is given to the pattern forming substrate. The photomask and the pattern forming substrate may be arranged to adhere closely to each other. In the invention, it is preferred to arrange the photomask and the pattern forming substrate to make a gap therebetween. When the line width of the property varied pattern is set into the range of 1 to 100 μm, the width of this gap is set preferably into the range of 0.1 to 100 μm, more preferably into the range of 1 to 50 μm. When the light width of the property varied pattern is set into the range of more than 100 μm and 1000 μm or less, the gap is set preferably into the range of 10 to 200 μm, more preferably into the range of 50 to 200 μm. This makes it possible to pattern the pattern forming substrate evenly.

In the invention, it is sufficient that such an arrangement state of the photomask is maintained only during the radiation of the vacuum-ultraviolet light.

The shape and the area of the property varied pattern formed in the present step, and other properties thereof are appropriately selected in accordance with the kind and the usage of the pattern formed body, and others.

3. Others

The manufacturing method of a plurality of pattern formed bodies according to the invention is not particularly limited as long as the method comprises the foreign matter removing step and the pattern forming step. Thus, the method may have, for example, a step of producing the pattern forming substrate besides these steps.

Any one of the pattern formed bodies manufactured by the invention can be used to form, for example, a color filter in which a colored layer is formed on the above-mentioned property varied pattern, an organic EL element in which an organic EL layer is formed on the property varied pattern, or a microlens in which lenses are formed on the property varied pattern. According to the invention, the property varied pattern can be rendered a target pattern formed with a high precision; thus, various functional parts such as a colored layer and an organic EL layer can be formed with a high precision. Any one of the pattern formed bodies manufactured by the invention may be used as a cell culturing substrate in order to culture cells. In this case, cells can be cultured into a target pattern form on the property varied pattern with a high precision.

The invention is not limited to the above-mentioned embodiments. The embodiments are mere examples and any modification that has substantially the same structure as these embodiments, which embody the technical conception recited in the claims of the invention, and that produces the same advantageous effects as the embodiments is included in the technical scope of the invention.

EXAMPLES

Example 1

(Production of a Pattern Forming Substrate)

A glass container in which 0.5 mL of decylmethoxysilane (trade name: LS 5258, manufactured by Shin-Etsu Chemical Co., Ltd.) and a glass substrate were put into a heat-resistant container with a lid, and then this heat-resist container was sealed. The heat-resistant container was put into an oven heated to 165° C., and then held in the oven for 1 hour so as to turn the inside of the heat-resistant container to the atmosphere of decylmethoxysilane. In this way, decylmethoxysilane was vapor-deposited onto a surface of the glass substrate so as to yield a pattern forming substrate having a transparent and homogeneous wettability variable layer.

(Pattern Forming Step)

Over a quartz glass substrate, a photomask having a mask pattern in which a Cr thin film was made into a stripe form having a line width of 50 μm and a line pitch of 100 μm, and the wettability variable layer were opposed to each other so as to have a gap having a width of 10 μm therebetween. Vacuum-ultraviolet light having a wavelength of 172 μm from an excimer lamp was radiated from the side of the photomask onto the opposed members at a luminance of 10 mW/cm$^2$, so as to expose the wettability variable layer to the light, thereby forming a wettability varied pattern in the surface of the wettability variable layer. In the resultant wettability varied pattern, the contact angle of its unexposed portion with water was 108° and that of the portion with a liquid having a surface tension of 40 mN/m was 72°, and 40 seconds was required until the contact angle of its exposed portion with water became 10° or less and that of the portion with the liquid, which has a surface tension of 40 mN/m, became 9° or less. The line width of the unexposed portion was 48 μm, and that of the exposed portion was 52 μm. The line width of the wettability varied pattern was measured by observing the surface of the pattern formed body with a scanning electron microscope.

(Foreign Matter Removing Step and Pattern Forming Step)

Subsequently, in a foreign matter removing step, vacuum-ultraviolet light having a wavelength of 172 nm from the same excimer lamp that was used as the light source in the above-mentioned pattern forming step was radiated from the side of the photomask onto the photomask exposed to the light as described above at a luminance of 10 mW/cm$^2$ for 30 seconds, so as to remove the foreign matter deposited to the surface of the photomask. Thereafter, in a pattern forming step, vacuum-ultraviolet light was radiated through the above-mentioned photomask onto a pattern forming substrate equivalent to the above-mentioned pattern forming substrate for 40 seconds in the manner as described above.

The above-mentioned foreign matter removing step and the pattern forming step were each repeated 50 times to manufacture 50 pattern formed bodies each having a wettability varied pattern. In the wettability varied pattern of the 50$^{th}$ pattern formed body, the line width of its unexposed portion was 51 μm and the line width of its exposed portion was 49 μm. In the wettability varied patterns of the 50 pattern formed bodies, the average line width of their exposed portions was 48 μm.

Example 2

(Pattern Forming Step)

A pattern formed body and a photomask equivalent to those used in Example 1 were used to perform exposure to light in the same way as in Example 1. In the resultant wettability varied pattern, the contact angle of its unexposed portion with water was 108° and that of the portion with a liquid having a surface tension of 40 mN/m was 72°, and 40 seconds was required until the contact angle of its exposed portion with water became 10° or less and that of the portion with the liquid, which has a surface tension of 40 mN/m, became 9° or less. The line width of the unexposed portion was 49 μm, and that of the exposed portion was 51 μm. The line width of the wettability varied pattern was measured by observing the surface of the pattern formed body with the scanning electron microscope.

(Foreign Matter Removing Step and Pattern Forming Step)

Subsequently, in a foreign matter removing step, the photomask exposed to the light as described above and a reflecting plate, made of aluminum, for reflecting energy from the above-mentioned excimer lamp were opposed to each other, and vacuum-ultraviolet light having a wavelength of 172 nm was radiated from the side of the photomask onto the opposed members at a luminance of 10 mW/cm$^2$ for 15 seconds to remove a foreign matter deposited to the surface of the photomask. Thereafter, in a pattern forming step, vacuum-ultraviolet light was radiated through the photomask onto a pattern forming substrate equivalent to the above-mentioned pattern forming substrate for 40 seconds in the manner as described above.

The above-mentioned foreign matter removing step and the pattern forming step were each repeated 50 times to manufacture 50 pattern formed bodies each having a wettability varied pattern. In the wettability varied pattern of the 50$^{th}$ pattern formed body, the line width of its unexposed portion was 51 μm and the line width of its exposed portion was 49 μm. In the wettability varied patterns of the 50 pattern formed bodies, the average line width of their exposed portions was 48 μm.

Comparative Example 1

(Pattern Forming Step)

A pattern forming substrate and a photomask equivalent to those used in Example 1 were used to perform exposure to light in the same way as in Example 1. In the resultant wettability varied pattern, the contact angle of its unexposed portion with water was 108°, and that of the portion with a liquid having a surface tension of 40 mN/m was 72°, and 40 seconds was required until the contact angle of its exposed portion with water became 10° or less and that of the portion with the liquid, which has a surface tension of 40 mN/m, became 9° or less. The surface of the pattern formed body was observed with the scanning electron microscope to measure line widths of the wettability varied pattern. As a result, the line width of the unexposed portion was 49 μm, and the line width of the exposed portion was 51 μm.

Subsequently, vacuum-ultraviolet light was radiated through the photomask onto each of 20 pattern forming substrates equivalent to the above-mentioned pattern forming substrate for 40 seconds without performing any foreign matter removing step. It was found out that, out of the 20 pattern forming substrates, as the number of the pattern forming substrates exposed to the light increases, the line width of ink caused to adhere onto its exposed portion tended to become larger as compared with the width of a line as each opening in the photomask. In the 8$^{th}$ pattern formed body and the subsequently-formed pattern formed bodies, ink got wet and spread onto the entire surface of their substrates. Thus, no pattern was formed.

What is claimed is:

1. A manufacturing method of a plurality of pattern formed bodies, comprising a pattern forming step and a foreign matter removing step,
    wherein the pattern forming step is a step of radiating vacuum-ultraviolet light through a photomask to a pattern forming substrate, varying a surface property by the vacuum-ultraviolet light, and forming a property varied pattern with the property varied on a surface of the pattern forming substrate to form a pattern formed body;
    the pattern forming step is repeated plural times to manufacture a plurality of the pattern formed bodies;
    the foreign matter removing step is a step performed between the repeated pattern forming steps and of radiating vacuum-ultraviolet light from same light source as used in the pattern forming step to the photomask, in a state where the photomask and the pattern forming substrate are not opposed to each other, to remove an foreign matter deposited onto the photomask;
    wherein the foreign matter removing step is performed by radiating the vacuum-ultraviolet light in a state where the photomask and a reflecting plate for reflecting the vacuum-ultraviolet light from the light source are opposed to each other.

* * * * *